Figure 1:
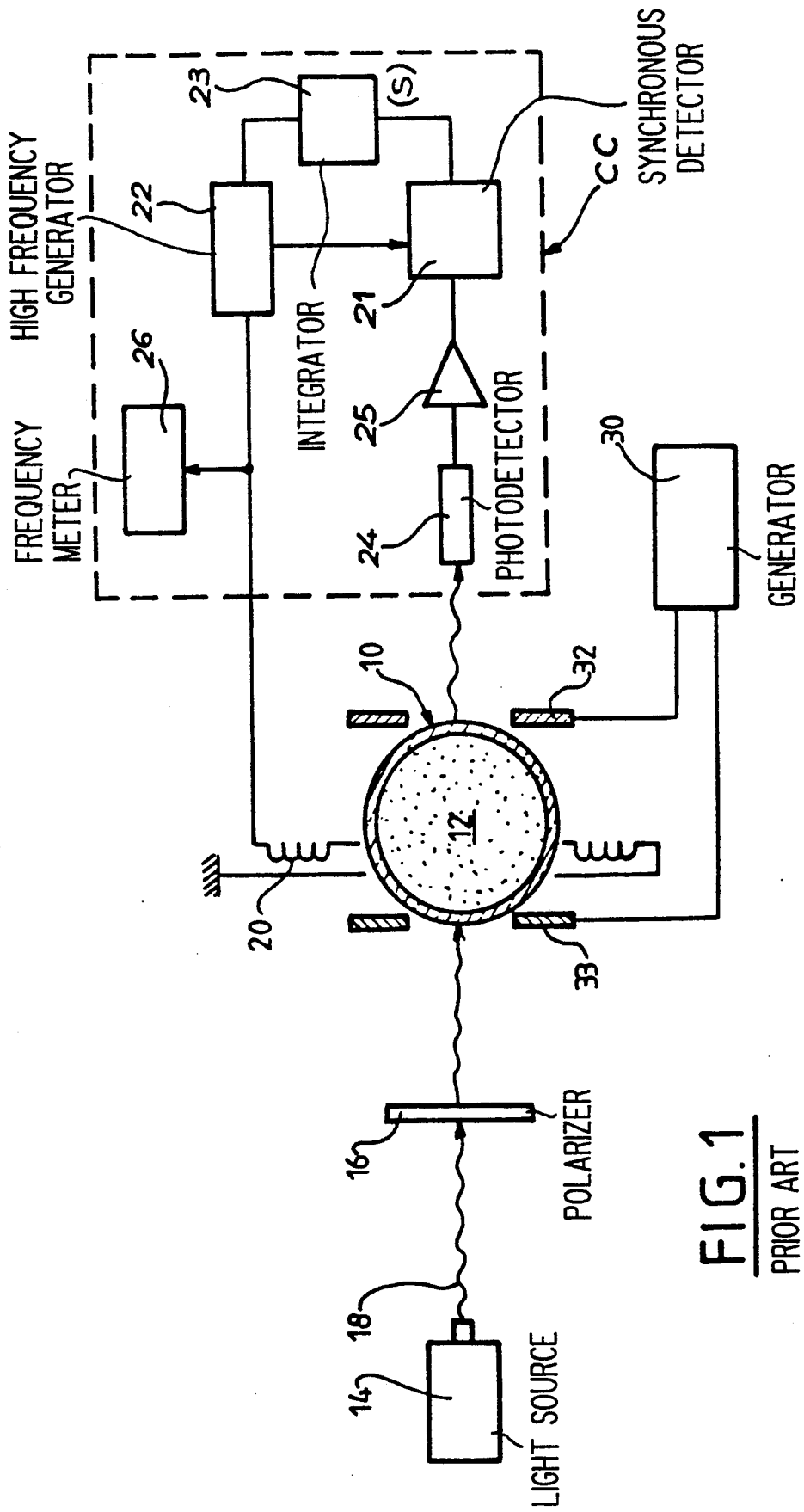

United States Patent [19]
Chaillout et al.

[11] Patent Number: 5,254,947
[45] Date of Patent: Oct. 19, 1993

[54] OPTICAL PUMPING, RESONANCE MAGNETOMETER USING A PLURALITY OF MULTIPLEXED BEAMS

[75] Inventors: Jean-Jacques Chaillout, St Etienne de Crossey; Nelly Kernevez, Grenoble; Jean-Michel Leger, Meylan, all of France

[73] Assignee: Commissariat a l'Energie Atomique, Paris, France

[21] Appl. No.: 712,408

[22] Filed: Jun. 10, 1991

[30] Foreign Application Priority Data

Jun. 14, 1990 [FR] France .................... 90 07413

[51] Int. Cl.$^5$ .............................................. G01V 3/00
[52] U.S. Cl. ........................................ 324/304; 324/302
[58] Field of Search ............... 324/300, 302, 304, 305, 324/318, 322

[56] References Cited

U.S. PATENT DOCUMENTS

| | | | |
|---|---|---|---|
| 3,863,144 | 1/1975 | Simpson et al. | 324/304 |
| 4,209,746 | 6/1980 | Abramov et al. | 324/304 |
| 4,509,014 | 4/1985 | Karwacki et al. | 324/305 |

FOREIGN PATENT DOCUMENTS

| | | |
|---|---|---|
| 0246146 | 11/1988 | European Pat. Off. |
| 0288927 | 11/1988 | European Pat. Off. |
| 57-14759 | 1/1982 | Japan |
| 964027 | 7/1964 | United Kingdom |

OTHER PUBLICATIONS

"Low field helium magnetometer for space applications", vol. NS-10, No. 1, 1963, R. E. Slocum et al, pp. 165-171.

*Primary Examiner*—Louis Arana
*Attorney, Agent, or Firm*—Oblon, Spivak, McClelland, Maier & Neustadt

[57] ABSTRACT

A magnetometer for precise measurement of weak magnetic fields involves a system which injects a plurality of light beams into a gas containing cell. An optical multiplexer receives the light beams emitted by a source and successively supplies a plurality of light beams which traverse a corresponding number of polarizers. The beams are subsequently injected into the cell 10 in the plurality of different directions in order to optically pump the gas. A detection device detects an electrical resonance signal and supplies a plurality of signals corresponding to the optical pumping beams.

20 Claims, 5 Drawing Sheets

OPTICAL PUMPING, RESONANCE MAGNETOMETER USING A PLURALITY OF MULTIPLEXED BEAMS

DESCRIPTION

The present invention relates to a magnetometer. It is used in the precise measurement of weak magnetic fields (typically in the range 20 to 70 μT corresponding to the values of the earth's magnetic field).

The magnetometer according to the invention is of the so-called resonance magnetometer type and a general description thereof is provided in the article by F. HARTMAN entitled "Resonance Magnetometers", published in the journal "IEEE Transactions of Magnetics", vol. MAG—8, No. Mar. 1, 1972, pp 66 to 75.

A resonance magnetometer is an apparatus which, immersed in a magnetic field Bo, supplies an electric signal of frequency F, whose value is linked with Bo by the so-called LARMOR relation:

$$F = \gamma Bo$$

in which $\gamma$ is the gyromagnetic ratio (of an electron or nucleon as a function of the substance used). For example, for the electron, said ratio is 28 Hz/nT.

In the case of such equipment, the optical pumping magnetometer occupies a privileged position. The general construction of a magnetic resonance, optical pumping magnetometer is diagrammatically shown in FIG. 1.

An at least partly transparent cell 10 is filled with a gas 12, generally helium at a pressure of 1 to a few Torr. A light source 14 supplies a light beam 18, whose wavelength is approximately 1.1 μm in the case of helium. This beam is appropriately polarized by a means 16 and then injected into the cell 10.

In addition, a so-called weak or gentle radiofrequency or high frequency discharge is produced in the gas by a generator 30 connected to two electrodes 32, 33 arranged around the cell 10. This discharge produces atoms in a metastable state ($2^3S_1$ in the case of helium). The incident light beam 18 "pumps" these atoms from the metastable state to bring them into another excited state ($2^3P$).

In the presence of a magnetic field Bo, the energy levels are subdivided into sublevels, called ZEEMAN sublevels. A resonance between such sublevels can be established by a high frequency field (magnetic resonance) or by a modulation of the light (double optical resonance; COHEN, TANNOUDJI, Ann. Phys., 7, 1962, p 423). In the case of isotope 4 helium, the resonance is established between two electronic ZEEMAN sublevels of the metastable state. This resonance is revealed by various known electronic means, whereof one variant is shown in FIG. 1. It is a winding 20 positioned on either side of the cell 10 (in a so-called HELMHOLTZ arrangement), a high frequency generator 22 and a photodetector 24 receiving the light radiation which has passed through the cell, an amplifier 25, a synchronous detection means 21 and an integrator 23. All these means 21 to 26 will be referred to hereinafter by the reference CC. The generator 22 supplies the winding 20 with current at the frequency F, which creates an oscillating magnetic field, whereof one component maintains the resonance and on return modulates the light beam which is passed through the cell, said modulation constituting the signal. It is revealed by the synchronous detection at the output of the photodetector, via the amplifier. The reference is given by the generator. The output of the synchronous detection means corresponding to the component of the signal in phase with the reference serves as an error signal and the integrator eliminates its static error. This error signal readjusts the frequency F of the synthesizer to the LARMOR frequency. For this purpose the synthesizer must be voltage-controllable and it can also be replace by a voltage-controlled oscillator (V.C.O.).

Thus, an electric resonance signal is established in said loop at the LARMOR frequency. A frequency meter 26 gives it the value F. The field to be measured Bo is deduced by the relation $Bo = F/\gamma$.

Helium magnetometers of this type firstly used helium lamps. The recent availability of lanthanum-neodymium aluminate (or LNA) crystals has made it possible to produce lasers tunable about the wavelength of 1.083 μm precisely corresponding to the optical pumping line of helium. Therefore this type of laser has naturally taken the place of these lamps and has led to a significant performance improvement, so that interest has been reawakened in such equipment. Such a magnetometer equipped with a LNA laser is described in FR-A-2 598 518.

Although satisfactory in certain respects, such magnetomers still suffer from disadvantages. Thus, by their very nature, they are highly anisotropic, both in amplitude and frequency. Signal suppressions occur for certain orientations of the magnetic field to be measured. These unfavourable orientations correspond either to certain propagation directions of the light beam (in the case of a circular polarization), or to certain polarization directions (in the case of a linear polarization). Optical pumping then no longer produces the requisite polarization of the ZEEMAN sublevels of the atoms, or the detection of the resonance proves to be ineffective.

Various solutions have been proposed for obviating this disadvantage. For example, the U.S. company Texas Instruments recommends the use of several cells oriented in such a way that at least one supplies a usable signal. The Canadian company Canadian Aviation Electronics recommends orienting the magnetometer in an appropriate manner with respect to the field to be measured.

As the suppression zones of the signal are more extensive for a linearly polarized beam than for a circularly polarized beam, preference is generally given to working with circular polarization. However, with this type of polarization, a frequency shift phenomenon occurs due to the optical pumping and this gives rise to measurement errors.

Texas Instruments obviates this disadvantage by doubling the number of cells and by making one of them operate with clockwise circular polarization and the other with anticlockwise circular polarization. The frequency shifts observed in the two cells then have opposite signs and a compensation is possible by forming the mean of the two measured frequencies.

All these solutions, which amount to increasing the number of apparatuses, are not very satisfactory, due to excessive overall dimensions, the need to balance the various measuring channels, the control of the orientation of the cells, high power consumption, etc. Moreover, any installation must be produced in an amagnetic environment, which causes serious technological problems.

The present invention aims at obviating these disadvantages. For this purpose it proposes an optical pumping, resonance magnetometer, whose isotropy is excellent whilst still offering a simple construction with limited overall dimensions (it only has a single cell).

According to the invention this objective is achieved through the use of a plurality of light beams successively injected into the cell in different directions. In other words, a multiplexing of the light beams takes place. The plurality of beams used leads to the obtaining of a plurality of resonance signals, which are attenuated to a greater or lesser extent and/or suffer from an error (as a function of the orientation of the field to be measured with respect to the polarization used). However, it is still possible to extract from the said signals an overall signal free from these defects. The magnetometer then supplies a significant signal, no matter what the orientation of the magnetic field to be measured.

More specifically, the present invention relates to an optical pumping, resonance magnetometer comprising, apart from the aforementioned known means, an optical multiplexer receiving the light signal emitted by the source and successively supplying n light beams, n being an integer at least equal to 2, said n light beams traversing n polarization means and then being injected into the cell in n different directions or polarizations for pumping into it in optical manner the gas, the detection means of the electrical resonance signal successively supplying n components corresponding to n optical pumping beams.

Two variants are provided:

the first consists of taking the mean of the amplitudes of the plurality of n signals obtained, said mean necessarily exceeding the smallest of the amplitudes obtained, so that the measurement signal is always greater than the signal which would be provided by a magnetometer placed under the least favourable conditions;

the second consists of comparing the amplitude of the resonance signal obtained with one of the beams with a nominal value and if said amplitude is below the nominal value passage between the individual beams continues, but as soon as one of the amplitudes exceeds the nominal value, multiplexing is stopped and the corresponding beam retained.

In a third variant, the multiplexer is controlled by means sensitive to the orientation of the ambient field and able to determine which of the n beams is the most appropriate for the measurement of the ambient field, taking account of its orientation. These field orientation sensitive means can be constituted by a directional magnetometer or by a winding system having different axes.

In all these variants, the various light beams are preferably guided by optical fibres from the source to the cell passing through the multiplexer and the polarizers and from the cell to the photodector.

Each polarizing device associated with a beam can introduce a linear polarization or a circular polarization. A combination of a linear polarizer and a quarter-wave plate produces a circular polarization. A single linear polarizer supplies a linear polarization.

All these arrangements apply to optical pumping, resonance magnetometers, no matter what the pumped medium. However, in the present state of the art, preference is given to the use of helium. However, other known fluids or gases are not excluded from the invention, such as e.g. alkali metal vapours (cesium, rubidium, etc.).

In the same way, although the LNA laser is preferred in the pumping of helium cells, the invention is not limited to this source and any magnetometer using a random light source forms part of the invention, provided that it works with multiplexed beams. The resonance can be magnetic (excitation by a high frequency field) or optical (modulation of the light, optical multiresonance).

The invention is described in greater detail hereinafter relative to non-limitative embodiments and with reference to the attached drawings, wherein show:

FIG. 1, already described, a prior art magnetometer.

Figure 2:
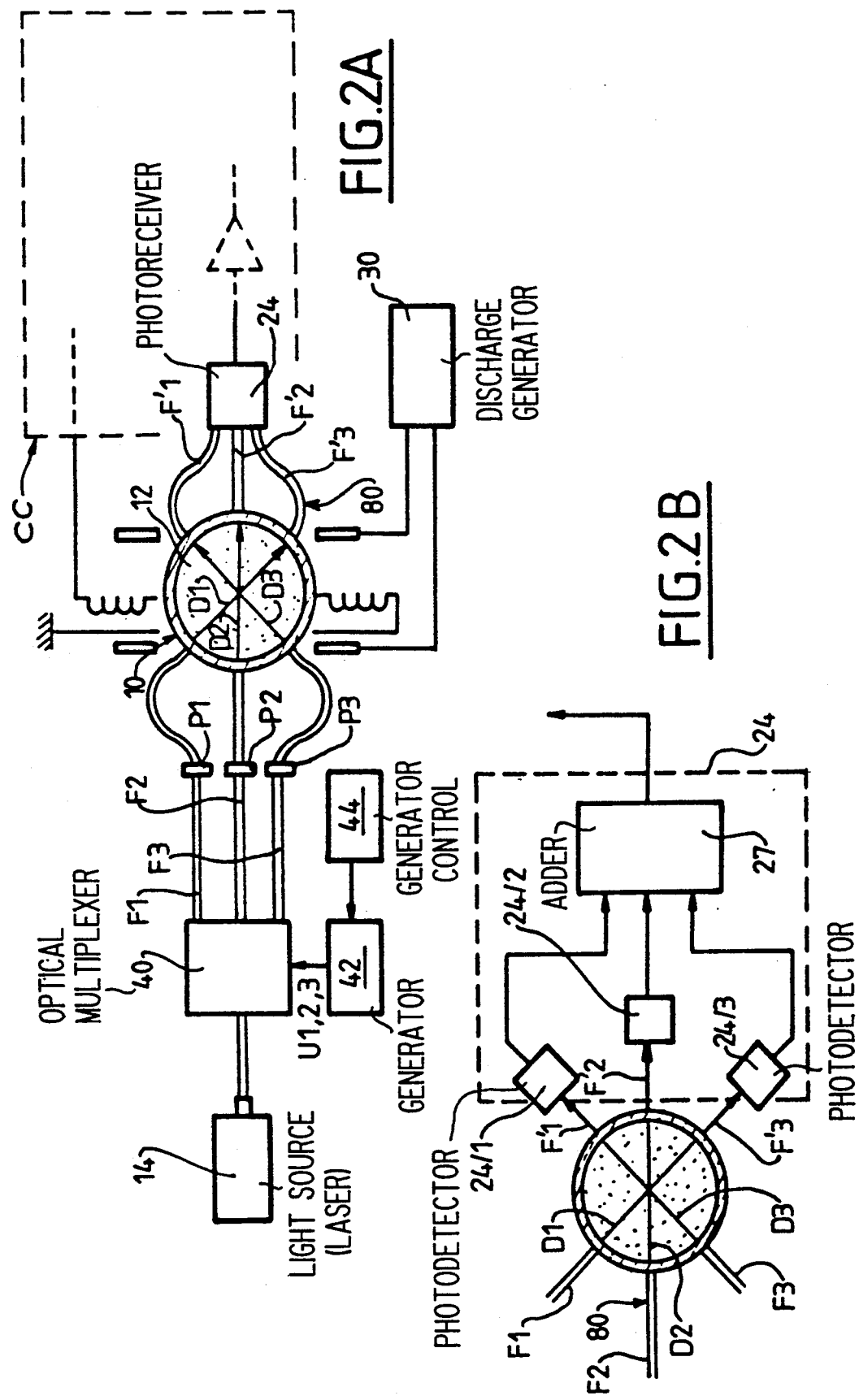

FIGS. 2A, 2B, diagrammatically a magnetometer according to the invention.

Figure 3:
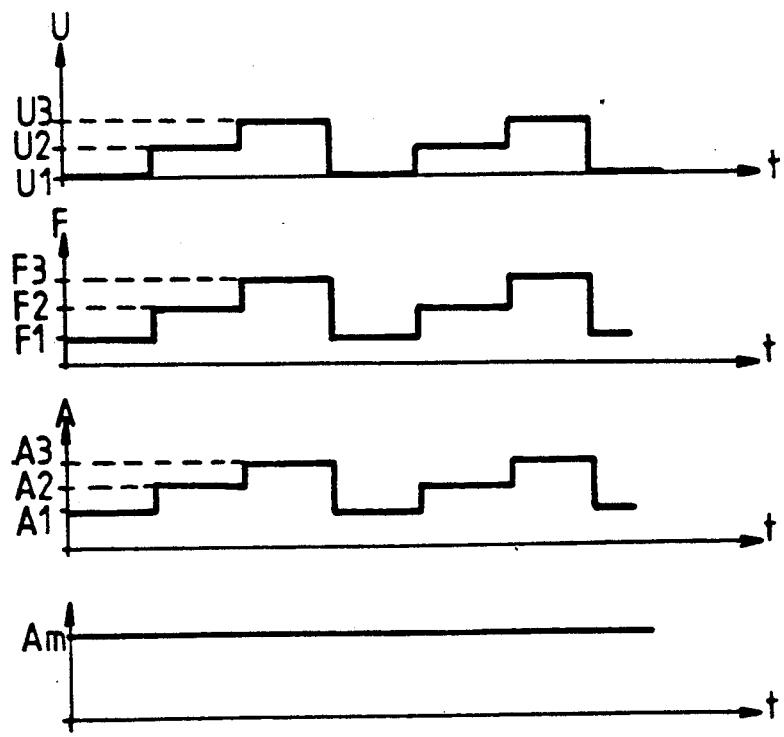

FIG. 3, an explanatory diagram of the operation of the magnetometer according to the invention.

Figure 4:
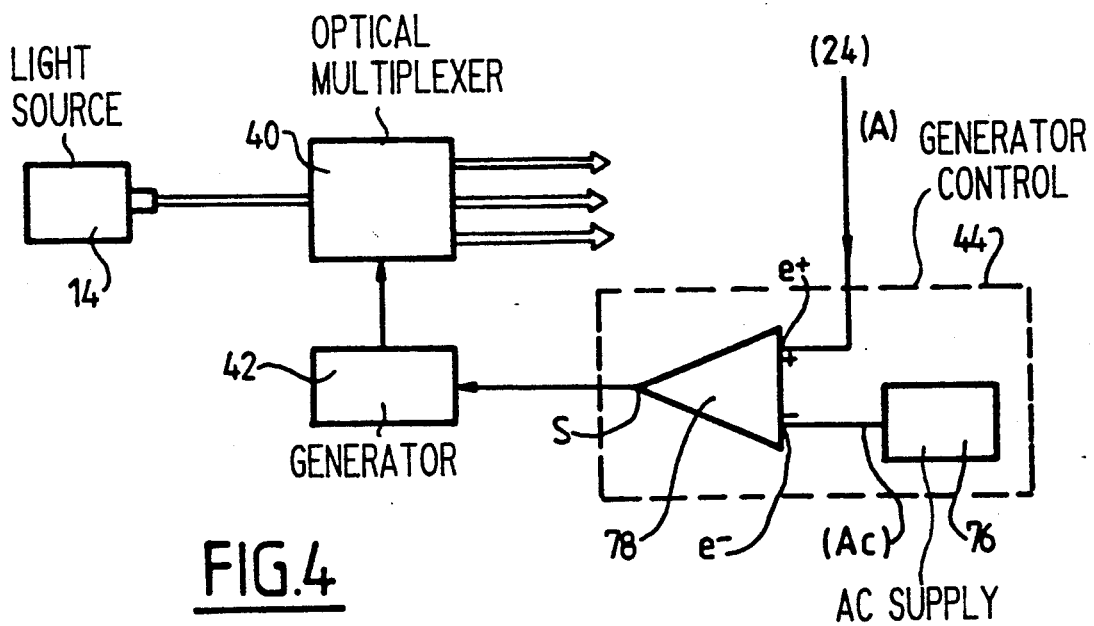

FIG. 4, a variant with nominal amplitude.

Figure 5:
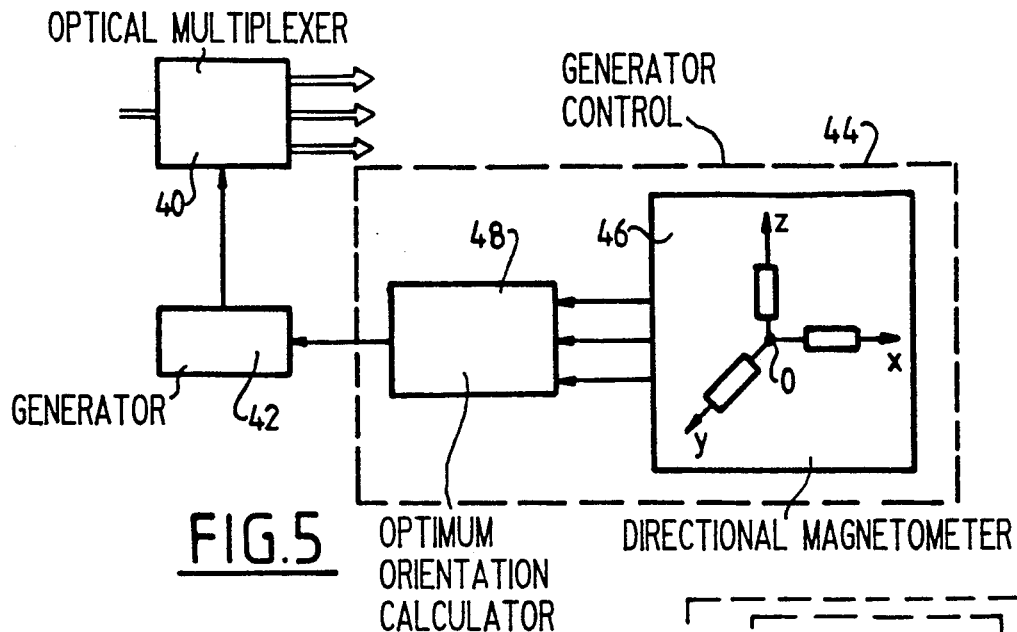

FIG. 5, a variant with a directional magnetometer.

Figure 6:
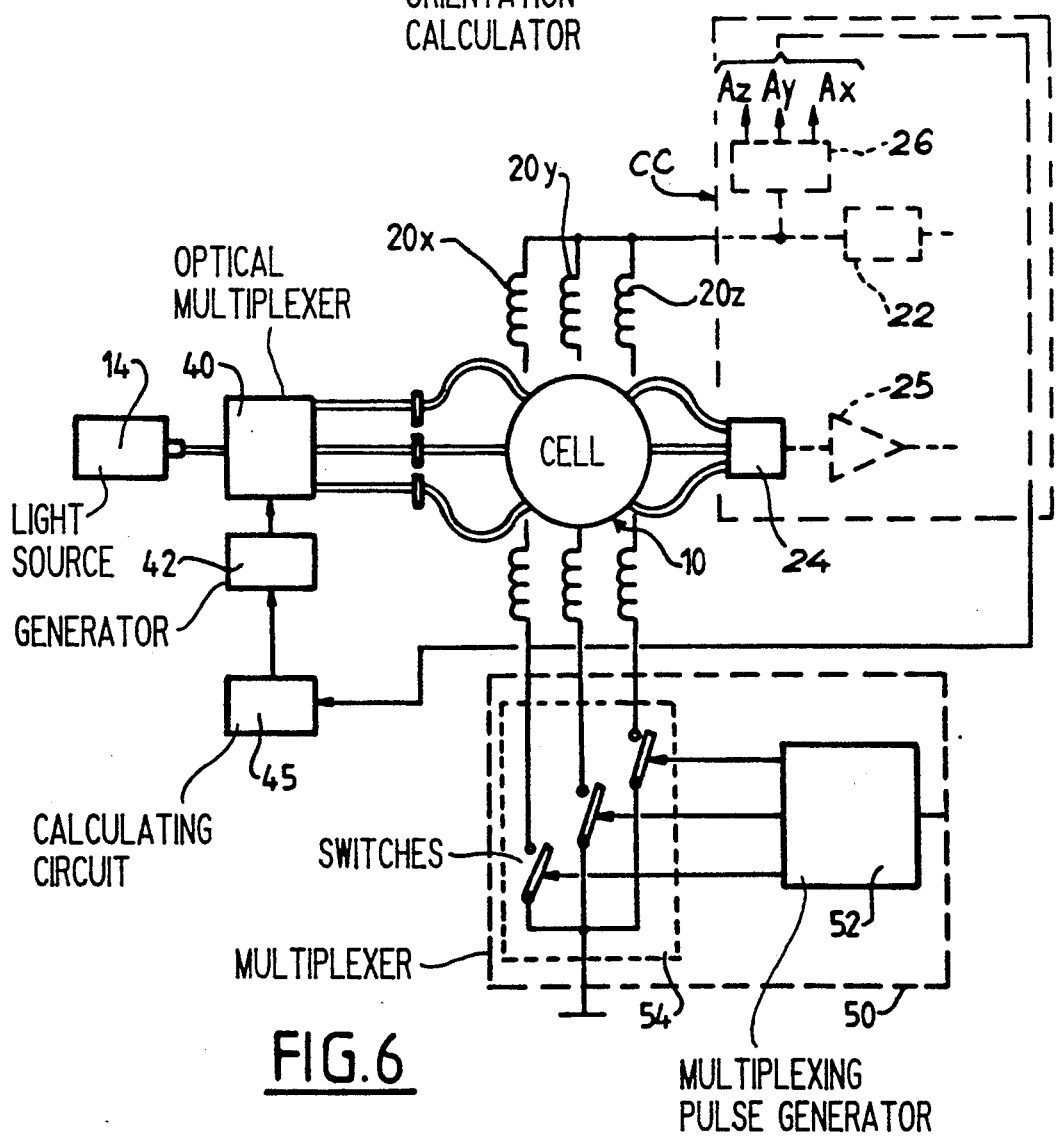

FIG. 6, a variant with multiplexed windings.

Figure 7:
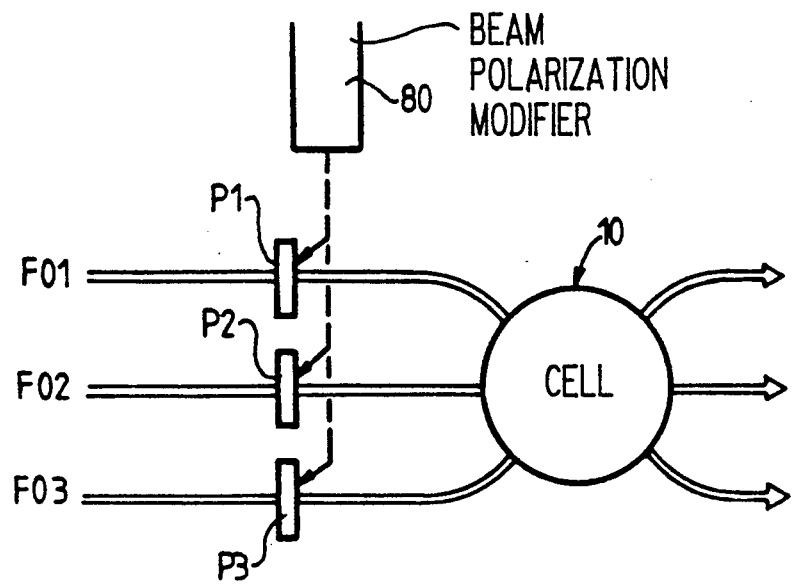

FIG. 7, a variant with polarization change on the same beam.

FIG. 8a, 8b, various examples of the possible orientation for the directions of the light beams.

The magnetometer shown in FIG. 2A firstly comprises known means already illustrated in FIG. 1 and which therefore carry the same numerical references. They consist of the helium-filled cell 10, the laser 14, the polarizing means 16, the winding 20 and the circuit CC (incorporating the high frequency generator 22, the photodetector 24, the frequency meter 26, the amplifier 25, the synchronous detection means 21 and the integrator 23) and the discharge generator 30. According to the invention, the magnetometer also comprises an optical multiplexer 30 e.g. having three outputs (of type SN 1:3 supplied by JDS Optics) controlled by a voltage generator 42. This multiplexer emits three light signals F1, F2, F3, preferably guided by three optical fibres. These beams traverse three polarizers P1, P2, P3 (linear or circular) and are injected into the cell 10 in three different directions D1, D2, D3.

The photodetection of the beams having traversed the cell can take place in two different ways. In the variant illustrated in FIG. 2A, three optical fibres guide the emergent beams F'1, F'2, F'3 towards a single photoreceiver 24. In the variant of FIG. 2B, three photodetectors 24/1, 24/2, 24/3 separately detect the three beams F'1, F'2, F'3 and an adder 27 forms the sum of the electrical signals. In other words the summation of the signals can be optical or electrical.

The magnetometer of FIG. 2A can also comprise means 44 able to control the generator 42, as will be described hereinafter in conjunction with FIGS. 4 to 6. It can also comprise a circuit 29 able to form the mean of the amplitudes of the electrical signals.

The diagram of FIG. 3 explains the operation of this apparatus. The generator 42 supplies three voltages U1, U2, U3, which control the optical multiplexer 40 (first line). As a function of the voltage applied, one beam from among three (FP1, FP2 or FP3) is emitted at the output of the multiplexer (second line). For each of these beams, the electrical resonance signal established in the circuit 20, 22, 24 has a certain amplitude, respectively A1, A2, A3 (third line). These amplitudes vary in size as a function of whether the direction or polarization of the beam D1, D2, D3 with respect to the field Bo to be measured is favourable or not. A circuit such as 25 able to form the mean of the signals supplies a mean amplitude signal Am (last line), which is the signal whose frequency F is measured.

According to an embodiment illustrated in FIG. 4, the magnetometer comprises a means 76 able to supply a nominal value Ac, a comparator 78 receiving on a first input e+ the amplitude A of the detected signal and on a second input e− the nominal value Ac. This comparator 78 has an output s connected to the generator 42.

The logic state of the output s (e.g. 1) obtained when the measured amplitude A is below the nominal value Ac has the effect of controlling the application to the generator 42 of a voltage able to maintain the multiplexing. The appearance of the other logic state on said output (0), when the measured amplitude A exceeds the nominal value Ac has the effect of stopping the multiplexing and of ensuring that the corresponding beam is maintained.

In the variants illustrated by FIGS. 2A, 2B and 4, multiplexing takes place autonomously without using auxiliary means. In another series of variants, the multiplexing is controlled from auxiliary means and diagrammatically illustrated by the block 44 in FIG. 2A. Several embodiments are provided.

The first is illustrated by FIG. 5. It corresponds to the use of a directional magnetometer 46, e.g. having three flux gates or with EPR (Electronic Paramagnetic Resonance), giving information on the direction of the ambient field Bo with respect to the three axes Ox, Oy and Oz. A circuit 48 processes this information and calculates the optimum orientation of the direction of the beam (taking account of its polarization) corresponding to said direction of the ambient field. As a consequence of this it controls the generator 42 in such a way that the multiplexer 40 selects the beam having the closest direction.

According to another embodiment illustrated in FIG. 6, use is made of an arrangement described, but used for a different purpose, in the French patent application simultaneously filed by the present Applicant and entitled "Magnetic resonance magnetometer having multiplexed exciting windings". This arrangement consists of providing the cell 10 with three detection windings 20x, 20y, 20z arranged around the cell 10 with different reciprocal orientation axes (e.g. in the form of a trirectangular trihedron). These windings are sequentially switched on by an electrical multiplexer 50 having a multiplexing pulse generator 52 and switches 54.

The use of several multiplexed windings makes it possible to obtain several resonance signals, whose respective frequencies Ax, Ay and Az are dependent on the relative orientations of the ambient field with respect to the axes of the windings. The knowledge of these frequencies makes it possible to determine the orientation of the field.

With the orientation of the field known, the optimum direction of the light beam can be deduced therefrom. It is the function of the calculating circuit 45 to determine this direction and provide the generator 42 with the control signal appropriate for the optical multiplexer 40. In this connection reference can be made to the article by COHEN-TANNOUDJI published in Annales de Physique, 7, 1962, p 423–429, which gives the amplitude of the signal as a function of the relative angles between the beam and the field.

As stated hereinbefore, the beams can have random polarizations and they can even be modified during operation. Thus, FIG. 7 shows a means 80 able to act on the polarizers P1, P2, P3 inserted in the optical guides F01, F02, F03.

A circular polarizer can be constituted by a linear polarizer and a quarter-wave plate, so that the means 80 is e.g. able to rotate the said plate by 90°, in order to pass from a clockwise circular polarization to an anticlockwise circular polarization, or by 45° to obtain a linear polarization. The means 80 can also retract the quarter-wave plate or the linear polarizer.

If the laser 14 emits an intrinsically linearly polarized radiation, the polarizers P1, P2, P3 can be eliminated, except if it is wished to rotate the polarization plane or pass to a circular polarization.

The choice of the number n of beams is dependent on the sought isotropy, the detection mode, the polarization type and the complexity which can be accepted for the apparatus. A number n equal to 3 would appear to be the minimum.

Figure 8:
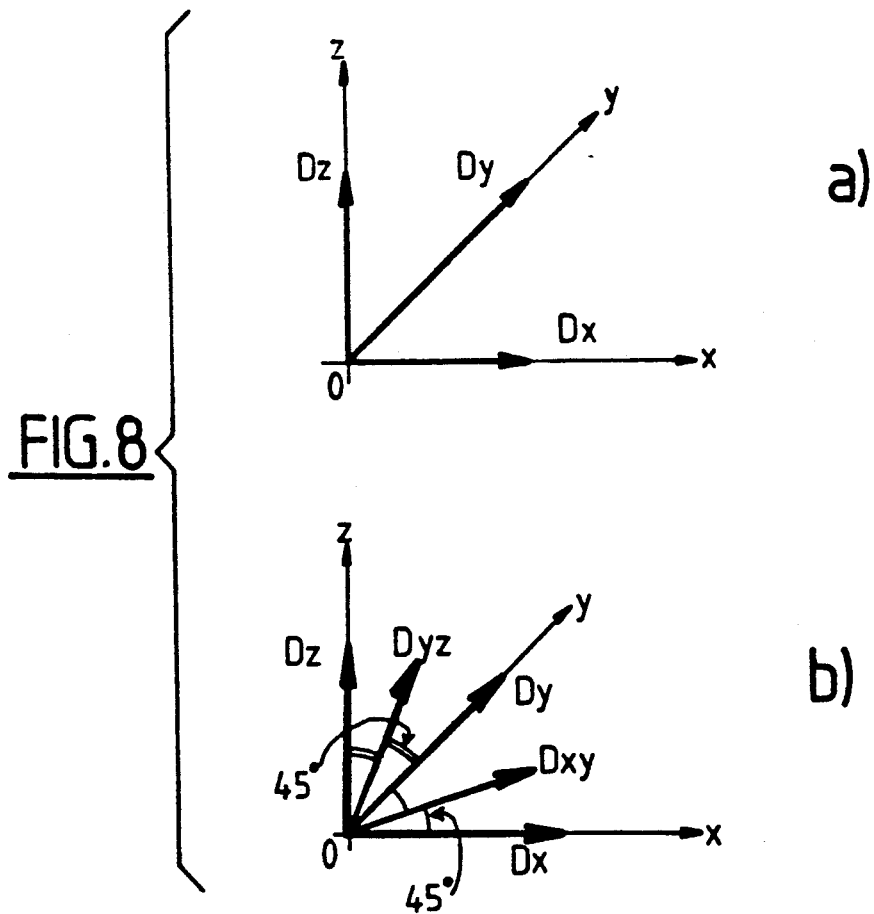

Thus, in an exemplified manner:

a) In the case of a transverse detection with circular polarization, the number n is equal to three with directions of the beams arranged in the form of a trirectangular trihedron. This is diagrammatically shown in part a of FIG. 8, where these directions are designated Dx, Dy, Dz. This arrangement makes it possible to obtain an isotropy with an amplitude of 57% (the isotropy being defined as the ratio of the minimum amplitude to the maximum amplitude).

b) In the case of a longitudinal detection with linear polarization, a number n equal to 5 would appear to be appropriate, according to part b of FIG. 8. Three of the polarization directions are in a trirectangular trihedron (Dx, Dy, Dz) and the two others (Dxy, Dxz) are in planes defined by two of the three directions Dx, Dy, Dz and at 45° of said directions.

Thus, the angle is dependent on the type of polarization used: when the polarization is circular, the angle in question is the angle formed by the field to be measured with the propagation direction of the light beams; when the polarization is linear, it is the angle which the field to be measured forms with the polarization direction.

We claim:

1. An optical pumping resonance magnetometer including a cell filled with a gas having a gyromagnetic ratio $\gamma$, wherein said cell is immersed in an ambient magnetic field $B_o$, which is to be measured;

a light source emitting a light beam;

means for detecting an electric resonance signal at a Larmor frequency given by $F=\gamma B_o$;

means for measuring said frequency;

means for deducing the amplitude of said ambient magnetic field from said frequency by the relation $B_o=F/\gamma$, said magnetometer further comprising:

an optical multiplexer receiving said light beam from said light source and successively supplying n light beams, n being an integer at least equal to 2, said n beams traversing n polarization means and subsequently being injected into said cell in n different polarizations in order to optically pump said gas to provide n optical pumping beams, wherein said detection means of said electrical resonance signal successively supplies n signals corresponding respectively to said n optical pumping beams.

2. Magnetometer according to claim 1 further comprising:

a means for supplying a nominal value;

a comparator receiving an amplitude of one of said supplied n signals on a first input and on a second input receiving said nominal value wherein said comparator includes an output connected to a control generator of said multiplexer and wherein a first logical state of said output is obtained when said amplitude of said one detected signal is below said nominal value and wherein said first logic state controls said generator for multiplexing of said optical beams and wherein a second logic state of said output, which is obtained when said amplitude of said one detected signal exceeds said nominal value, controls the stopping of said generator and the stopping of said multiplexing.

3. Magnetometer according to claim 1 wherein said multiplexer includes a control means sensitive to the orientation of said ambient field for selecting the one of said n beams having an orientation closest to the orientation of said ambient field.

4. Magnetometer according to claim 3, characterized in that the means sensitive to the orientation of the field are constituted by a directional magnetometer.

5. Magnetometer according to claim 3, characterized in that the means sensitive to the orientation of the field are constituted by:
- a plurality of three exciting windings arranged around the cell and having different axes,
- an electrical multiplexer sequentially switching on the windings and
- a circuit for processing the detection signal obtained with these three windings, said circuit determining which of the n beams is most appropriate for the measurement of the field.

6. Magnetometer according to claim 1, characterized in that it comprises a single photodetector receiving the n light signals having traversed the cell.

7. Magnetometer according to claim 1, characterized in that it comprises n photoreceivers respectively sensitive to the n light beams which have traversed the cell and an adder of n signals supplied by the n photoreceivers.

8. Magnetometer according to claim 1, characterized in that the n light beams supplied by the multiplexer are respectively guided by n optical fibres.

9. Magnetometer according to claim 6, characterized in that the n light beams having traversed the cell are respectively guided to the photodetector or photodetectors by n optical fibres.

10. Magnetometer according to claim 1, characterized in that each polarizer associated with each beam is a linear polarizer.

11. Magnetometer according to claim 1, characterized in that each polarizer associated with each beam is a circular polarizer.

12. Magnetometer according to claim 1, characterized in that certain polarizers are linear polarizers and others are circular polarizers.

13. Magnetometer according to claim 1, characterized in that the number n of beams is equal to three.

14. Magnetometer according to claim 13, characterized in that the three beams have circular polarizations and pairwise orthogonal directionals.

15. Magnetometer according to claim 1, characterized in that the number n of injected beams is equal to 5.

16. Magnetometer according to claim 15, characterized in that the five beams have linear polarizations, the directions of three of them forming a trirectangular trihedron and the directions of the two others being in two planes defined by two of the said three directions.

17. Magnetometer according to claim 1, characterized in that it comprises means for modifying the polarization on each light beam injected into the cell.

18. Magnetometer according to one of the claims 4–17 or 1–3, characterized in that the gas of the cell is helium.

19. Magnetometer according to claim 18, characterized in that it also comprises means for creating a high frequency discharge in the helium cell.

20. Magnetometer according to any one of the claims 4–17 or 1–3, characterized in that the light source is a laser.

* * * * *